(12) United States Patent
Cruzan et al.

(10) Patent No.: US 11,835,549 B2
(45) Date of Patent: Dec. 5, 2023

(54) THERMAL ARRAY WITH GIMBAL FEATURES AND ENHANCED THERMAL PERFORMANCE

(71) Applicant: Advantest Test Solutions, Inc., San Jose, CA (US)

(72) Inventors: Gregory Cruzan, San Jose, CA (US); Karthik Ranganathan, San Jose, CA (US); Gilberto Oseguera, San Jose, CA (US); Joe Koeth, San Jose, CA (US); Paul Ferrari, San Jose, CA (US); James Hastings, San Jose, CA (US); Chee Wah Ho, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 116 days.

(21) Appl. No.: 17/585,228

(22) Filed: Jan. 26, 2022

(65) Prior Publication Data
US 2023/0236241 A1 Jul. 27, 2023

(51) Int. Cl.
*G01R 31/28* (2006.01)

(52) U.S. Cl.
CPC ..... *G01R 31/2877* (2013.01); *G01R 31/2863* (2013.01)

(58) Field of Classification Search
CPC ............ G01R 31/2877; G01R 31/2863; G01R 31/2867; G01R 31/2868; G01R 31/2875
USPC ..................................................... 324/756.02
See application file for complete search history.

(56) References Cited

U.S. PATENT DOCUMENTS

| | | |
|---|---|---|
| 5,239,093 A | 8/1993 | Cheng |
| 5,821,505 A | 10/1998 | Tustaniwskyj et al. |
| 6,184,504 B1 | 2/2001 | Cardella |
| 6,359,264 B1 | 3/2002 | Schaper et al. |
| 6,668,570 B2 | 12/2003 | Wall et al. |
| 7,042,240 B2 | 5/2006 | Lopez et al. |
| 7,151,388 B2 | 12/2006 | Gopal et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,755,899 B2 | 7/2010 | Stenmark |

(Continued)

FOREIGN PATENT DOCUMENTS

| | | |
|---|---|---|
| EP | 3270261 A1 | 1/2018 |
| JP | 2005156172 A | 6/2005 |

(Continued)

*Primary Examiner* — Jermele M Hollington
*Assistant Examiner* — Courtney G McDonnough

(57) ABSTRACT

Embodiments of the present invention provide testing systems with liquid cooled thermal arrays that can pivot freely in three dimensions allowing surfaces to be brought into even, level, and secure contact, thereby preventing air gaps between surfaces and improving thermal performance. In this way, more DUTs can be tested in parallel within a small test space, overall costs of the test system are reduced, and greater cooling capacity can be provided for testing high-powered devices. Gimbaled mounts are disposed on a bottom surface of individual thermal interface boards (TIBs) of a test system, and/or on top of individual thermal heads of a thermal array (TA) having a common cold plate (or having multiple cold plates).

20 Claims, 16 Drawing Sheets

(56) References Cited

U.S. PATENT DOCUMENTS

| | | |
|---|---|---|
| 7,830,164 B2 | 11/2010 | Earle et al. |
| 7,848,106 B2 | 12/2010 | Merrow |
| 8,120,304 B2 * | 2/2012 | Yalei .................... G05B 19/19 318/560 |
| 8,558,540 B2 | 10/2013 | Wu et al. |
| 9,080,820 B2 | 7/2015 | Bolton |
| 9,291,667 B2 | 3/2016 | Armstrong et al. |
| 9,310,145 B2 | 4/2016 | Colongo et al. |
| 9,414,526 B2 | 8/2016 | Mann et al. |
| 9,494,353 B2 | 11/2016 | Yu et al. |
| 9,766,287 B2 | 9/2017 | Narasaki et al. |
| 9,841,772 B2 | 12/2017 | Bucher |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi |
| 11,143,697 B2 | 10/2021 | Wolff |
| 2002/0024355 A1 * | 2/2002 | Suzuki ................ G01R 1/07314 324/754.15 |
| 2002/0118032 A1 | 8/2002 | Norris et al. |
| 2003/0042921 A1 * | 3/2003 | Hollman ............. G01R 1/07392 324/750.14 |
| 2003/0155939 A1 | 8/2003 | Lutz et al. |
| 2005/0026476 A1 | 2/2005 | Mok et al. |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2006/0290370 A1 | 12/2006 | Lopez |
| 2009/0218087 A1 | 9/2009 | Oshima |
| 2010/0042355 A1 | 2/2010 | Aube et al. |
| 2011/0074080 A1 | 3/2011 | DiStefano et al. |
| 2013/0285686 A1 | 10/2013 | Malik et al. |
| 2014/0251214 A1 | 9/2014 | Cuvalc et al. |
| 2015/0028912 A1 | 1/2015 | Cho et al. |
| 2015/0226794 A1 | 8/2015 | Chen |
| 2016/0084880 A1 | 3/2016 | LoCicero et al. |
| 2016/0351526 A1 | 12/2016 | Boyd et al. |
| 2017/0102409 A1 | 4/2017 | Sarhad et al. |
| 2017/0219626 A1 * | 8/2017 | Gardell .............. G01R 1/07364 |
| 2018/0024188 A1 | 1/2018 | Cruzan et al. |
| 2018/0218926 A1 | 8/2018 | Stuckey et al. |
| 2019/0064254 A1 | 2/2019 | Bowyer et al. |
| 2019/0310314 A1 | 10/2019 | Liu et al. |
| 2019/0346482 A1 | 11/2019 | Kiyokawa et al. |
| 2020/0363104 A1 | 11/2020 | MacDonald et al. |
| 2020/0371155 A1 | 11/2020 | Walczyk et al. |
| 2021/0071917 A1 | 3/2021 | Pei et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0137129 A1 | 5/2022 | Ranganathan et al. |

FOREIGN PATENT DOCUMENTS

| | | |
|---|---|---|
| JP | 2008275512 A | 11/2008 |
| TW | 201504647 A | 7/2013 |
| TW | 201636618 A | 12/2014 |
| WO | 2016122039 A1 | 8/2016 |
| WO | 2017112076 A1 | 6/2017 |

* cited by examiner

THERMAL ARRAY WITH GIMBAL FEATURES AND ENHANCED THERMAL PERFORMANCE

FIELD

Embodiments of the present invention generally relate to the field of electronic device testing. More specifically, embodiments of the present invention relate to testing systems that test a high number of devices in parallel.

BACKGROUND

A device or equipment under test (e.g., a DUT) is typically tested to determine the performance and consistency of the electronic device before the device is sold. The device can be tested using a large variety of test cases, and the results of the test cases are compared to expected output results. When the result of a test case does not match the expected output value, the device can be considered a failed device or outlier, or the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer or other electronic device. By removing defective or unsatisfactory chips at manufacture using ATE, the quality of the yield can be significantly improved.

Conventional approaches to DUT testing that regulate temperature during testing rely on using multiple cold plates per tester, which results in additional cost and complexity to accommodate the typically large cold plates. For example, fluid used for cooling must be transported to each cold plate. Other approaches to DUT testing employ air cooled superstructures or heatsinks, but fail to provide the thermal performance of liquid cooled solutions. An approach to improve thermal performance and reduce complexity of testing systems that use liquid cooling (or refrigerant cooling) and cold plates for DUT testing is needed.

SUMMARY

Accordingly, embodiments of the present invention provide testing systems with liquid cooled thermal arrays (or refrigerant cooled thermal arrays) having components that pivot freely allowing corresponding surfaces to be brought into even, level, and secure contact ("intimate contact"), thereby preventing air gaps between surfaces and improving thermal performance. In this way, advantageously more DUTs can be tested in parallel within a small test space, overall costs of the test system are reduced, and greater cooling capacity can be provided for testing high-powered devices. The test systems can include any suitable type of gimbaling mechanism featuring a single mount or multiple mounts disposed at various locations. The gimballing mounts can use screws and springs or other well-known fixing means that enable freedom of movement in three dimensions.

As described more fully below, a first embodiment of the present invention involves using a common cold plate applied across a matrix of DUTs where each DUT (superstructure) has its own TEC/ATI layer and further each DUT has its own gimbal elements that are mounted on the bottom of the interface board. A second embodiment involves a respective cold plate for each DUT and a TEC/ATI layer for each DUT, but the gimbal elements are located on the cold plate/thermal head. A third embodiment involves a hybrid approach where each DUT has its own cold plate, each DUT has its own TEC/ATI layer, and the gimbal elements are located on both the interface board and the thermal heads/cold plates.

More specifically, according to one embodiment, a test system for testing a DUT is disclosed. The test system includes a burn in board (BIB), a socket interface board (SIB) comprising a gimbaling mount that fixes the SIB to the BIB, wherein the SIB is operable to pivot freely in three dimensions and a socket configured to receive the DUT, a superstructure that surrounds the socket, and a thermal array. The DUT is disposed in the socket, and a top surface of the superstructure evenly and securely contacts a bottom surface of the thermal array substantially without air gaps between the top surface of the superstructure and the bottom surface of the thermal array to cool the DUT during testing.

According to some embodiments, the superstructure comprises an interposer in contact with the DUT, and wherein the top surface of the superstructure is a top surface of the interposer.

According to some embodiments, the interposer further comprises a thermo electric cooler (TEC), and the top surface of the interposer is a top surface of the TEC.

According to some embodiments, the socket comprises a self-actuating socket (SAS).

According to some embodiments, the socket comprises a parallel socket actuation (PSA) socket.

According to some embodiments, the test system further includes a plurality of SIBs disposed on the BIB, wherein the plurality of SIBs are individually gimballed to align with the thermal array.

According to some embodiments, the thermal array comprises a plurality of thermal heads coupled to a plurality of gimballing mounts, the plurality of gimballing mounts fix the plurality of thermal heads to a tray of the thermal array, and the plurality of thermal heads are operable to pivot freely in three dimensions.

According to some embodiments, the SIBs and the thermal heads pivot to align top surfaces of superstructures of the plurality of SIBs with a bottom surface of the thermal heads.

According to some embodiments, the gimballing mount comprises a plurality of screws and springs disposed at corners of the SIB.

According to some embodiments, the thermal array comprises a cold plate and one or more thermo electric coolers (TECs).

According to some embodiments, the thermal array comprises a cold plate and one or more electric heaters.

According to a different embodiment, a test system is disclosed including a test interface board (TIB), a socket interface board (SIB) disposed on the TIB comprising a socket configured to receive the DUT, a superstructure surrounding the socket, and a thermal array. The thermal array includes a gimballing mount that fixes the thermal array to a fixed tray, and a thermal head coupled to the gimbaling mount. The thermal head is operable to pivot freely in three dimensions. The DUT is disposed in the socket, and a top surface of the superstructure evenly and securely contacts a bottom surface of the thermal head substantially without air gaps between the top surface of the DUT and the bottom surface of the thermal head to cool the DUT during testing.

According to some embodiments, the superstructure further comprises an interposer, the DUT contacts the interposer, and the top surface of the superstructure is the top surface of the interposer.

According to some embodiments, the socket comprises a self-actuating socket (SAS).

According to some embodiments, the socket comprises a parallel socket actuation (PSA) socket.

According to some embodiments, the test system includes a plurality of SIBs disposed on the TIB, and the thermal array includes a plurality of individually gimballed thermal heads for cooling DUTs of the plurality of SIBs.

According to some embodiments, the TIB comprises a SIB support block that supports the SIB.

According to some embodiments, the gimballing mount comprises a screw and a spring.

According to some embodiments, the thermal array is liquid-cooled.

According to some embodiments, the test system includes a second gimballing mount that fixes the SIB to the TIB, and the SIB is operable to pivot freely in three dimensions.

According to some embodiments, the SIB and the thermal head pivot to align the top surface of the superstructure with a bottom surface of the thermal head.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
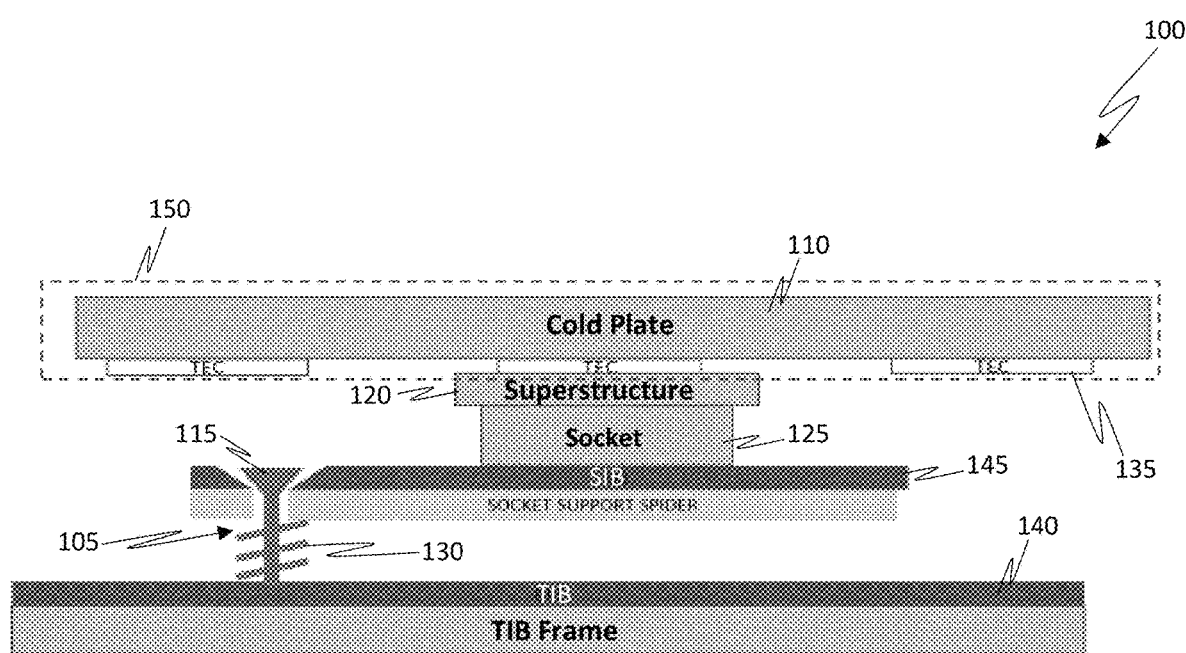
FIG. 1 is a cross section of an exemplary LCTA with SIBs that can gimbal in multiple directions using gimbal mounts that fix the SIBs to the TIB according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting,"

"associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Thermal Array with Gimbal Features and Enhanced Thermal Performance

Embodiments of the present invention provide testing systems with liquid cooled thermal arrays (or refrigerant cooled thermal arrays) that can pivot/rotate about a fixed axis thereby allowing surfaces to be brought into even, level, and secure contact with each other ("intimate contact"), thereby preventing air gaps between surfaces and improving thermal performance. By making intimate contact between surfaces, thermal transfer is improved between the surfaces. In this way, more DUTs can be tested in parallel within a small test space, overall costs of the test system are reduced, and greater cooling capacity can be provided for testing high-powered devices. The test systems can include any suitable type of gimbaling mechanism featuring a single mount or multiple mounts which are disposed at various locations. The gimballing mounts can use screws and springs or other well-known fixing means that enable required freedom of movement in three dimensions.

According to some embodiments, gimbaled mounts are disposed on a bottom surface of individual socket interface boards (SIBs) of a test system. Each individual SIB can be gimbaled as necessary to achieve intimate contact with a respective cold plate (or thermo electric cooler) for efficient cooling. According to other embodiments, gimbaled mounts are disposed on top of individual thermal heads of a thermal array (TA) having a common cold plate (or having multiple cold plates). Screws on either side of the thermal head are used to re-center the thermal head, and springs disposed around the screws maintain the head level when not engaged with a socket. Test interface boards (TIBs) can be loaded into a handler that allows the TIBs to be received by an elevator for insertion into tester slots of the test system. Some embodiments of the present invention include self-actuated sockets (SAS) or parallel socket actuators (PSAs) that simultaneously activate all superstructures. According to some embodiments, both the socket interface boards and the thermal heads are gimballed so that their surfaces can be aligned correctly.

FIG. 1 depicts an exemplary tester 100 consisting of a low-cost thermal array (LCTA) 150 with its cold plate 110 and TECs 135. LCTA 150 is positioned above TIB 140. Between testing operations, the LCTA is normally lifted a few millimeters so that TIB 140 can be moved out to the handler/PSA, be fitted with untested DUTs, and brought back into the area under LCTA 150. FIG. 1 shows LCTA 150 after it has been lowered to create intimate contact with superstructure 120 which is part of TIB 140. TIB 140 contains one or more SIBs 145, each consisting of a superstructure 120, socket 125, and SIB circuit board (labeled "SIB"). Each SIB 145 is separately gimbaled using screws 115 and springs 130 with SIBs 145 that can gimbal in multiple directions ("float") using gimbal mounts 105 that fix SIBs 145 to test interface board (TIB) 140 according to embodiments of the present invention. In the example of FIG. 1, the DUT is installed in socket 125. The DUT, along with the electrical contacts located in the socket 125 beneath the DUT are both compressed by an interposer within superstructure 120 having smooth top and bottom surfaces fitted with thermal interface material (TIM). Alternatively, test system 100 can include self-actuated sockets with a flat top, according to some embodiments. When the TIB 140 is moved beneath LCTA 150 for DUT testing, cold plate 110 moves down approximately 2 mm (for instance) to force SIB 145 below the normal mounting height.

Multiple SIBs 145 with sockets can be mounted on a BIB (Burn-In Board) or TIB (Test Interface Board) 140. The SIBs can be mounted using specialized SIB mounts 105 in one or more locations to allow SIBs 145 to float/gimbal in three dimensions, thereby enabling intimate contact between thermo electric cooler (TEC) 135 coupled to cold plate 110 and superstructure 120 when thermal array 150 is actuated downward. Thermal array 150 can be brought into contact with self-actuating sockets or with socket superstructures that were previously actuated using a parallel socket actuator (PSA). In either case, the simultaneously actuated all the superstructures prior to bringing the TIB into the vicinity of LCTA 150.

Gimbaling SIB mount 105 in accordance with embodiments of the present invention improves thermal performance by ensuring a close, intimate connection between the cold plate 110 surface and TEC 135 surface coupled to the superstructure/interposer, while at the same time reducing the cost and complexity of liquid cooling testing. According to some embodiments, a gimbaling SIB mount is disposed under a center portion of the SIBs. After testing is complete, thermal array 150 returns upward to its disengaged position. Spring 130 presses the SIBs against the tapered-head fasteners 115 for PSA operations. The SIBs can float/gimbal advantageously so that the PSA can align correctly with the SIBs. According to some embodiments, SIB 145 is gimballed and mounted to BIB 140 using a screw and spring disposed at each corner of the SIB 145. According to other embodiments, only three springs and three screws are used to mount the SIB.

Figure 2:
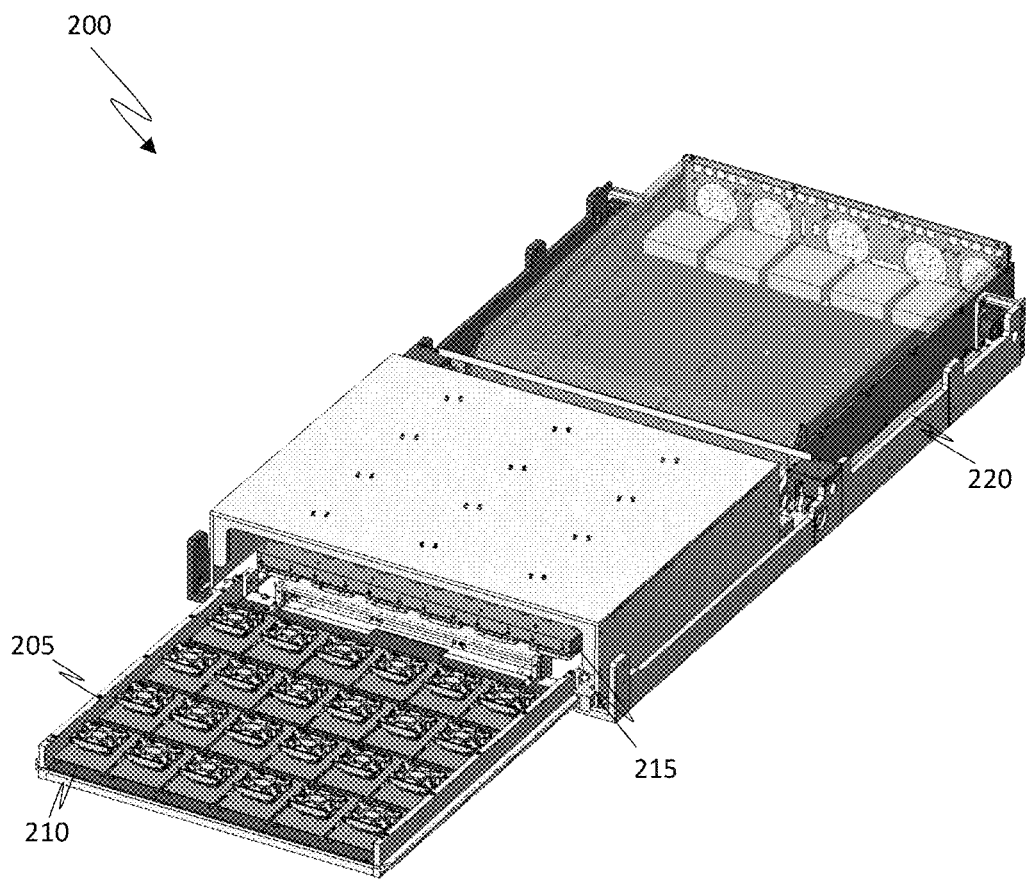
FIG. 2 is a diagram an exemplary system slot thermal array including SIBs that can gimbal in multiple directions using gimbal mounts disposed on the bottom side of thermal array according to embodiments of the present invention.

FIG. 2 is a diagram of an exemplary tester slot including a TIB mounted with SIBs that slides beneath a thermal array 200 fitted with cold plate 215. The cold plate can gimbal in multiple directions using gimbal mounts disposed on the bottom side of thermal array 200 according to embodiments of the present invention. In the example of FIG. 2, TIB 205 beneath thermal array 200 includes multiple SIBs 210 with SAS or PSA actuated sockets. The SIBs 210 are mounted to TIB 205 using specialized SIB mounts in multiple (e.g., 4) different locations on a bottom surface of SIBs 210 to allow SIBs 210 to float/gimbal in three dimensions for improved contact with cold plate 215 of thermal array 200. Thermal array 200 may be powered by system slot power delivery board (PDB) 220. The DUTS are disposed in the sockets of the SIBs 210.

Figure 3:
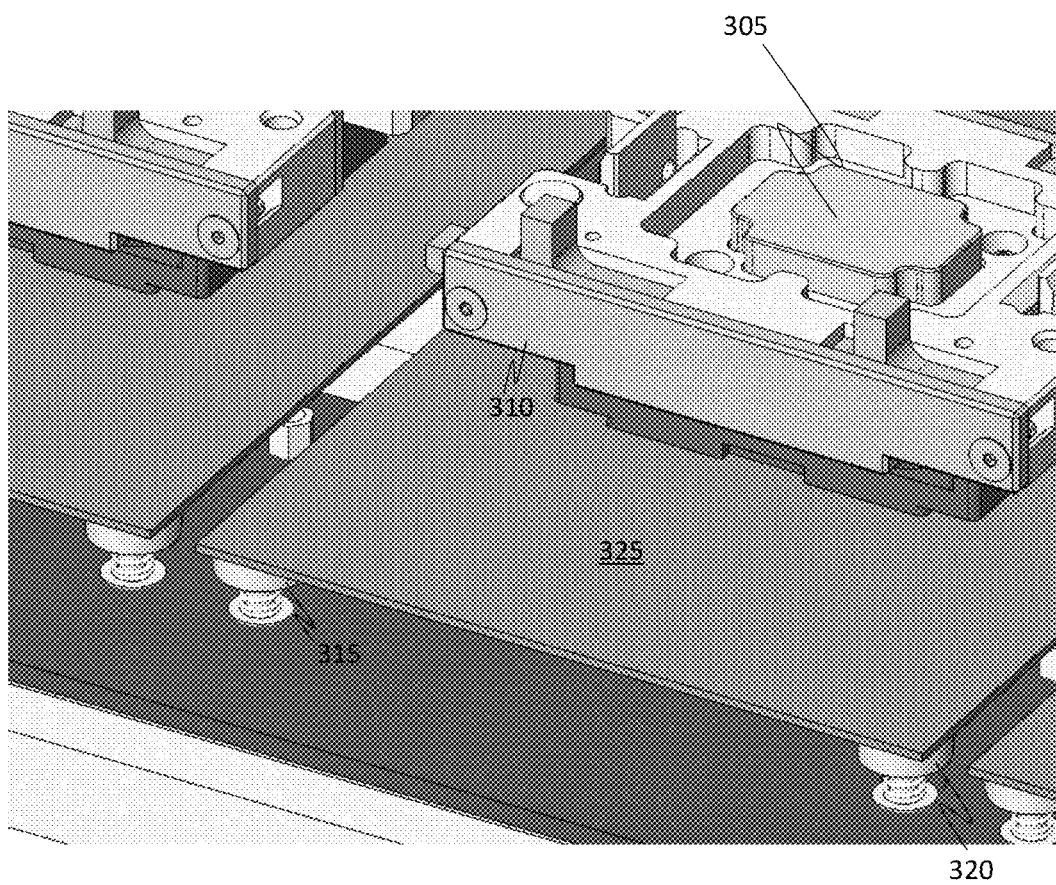
FIG. 3 is a diagram depicting a close view of an exemplary SIB, socket, and superstructure with gimbaling features shown according to embodiments of the present invention.

FIG. 3 is a diagram depicting a close view of an exemplary interposer 305 disposed within socket superstructure 310 and contacting a DUT during testing. The top side of interposer 305 is brought into contact with the TEC coupled to the cold plate. Gimbaling mounts 315 and 320 include a screw with a tapered head and optionally a spring for positioning interposer 305 into contact with the TEC. According to some embodiments, gimbaling mounts are disposed at all four corners of SIB 325.

Figure 4:
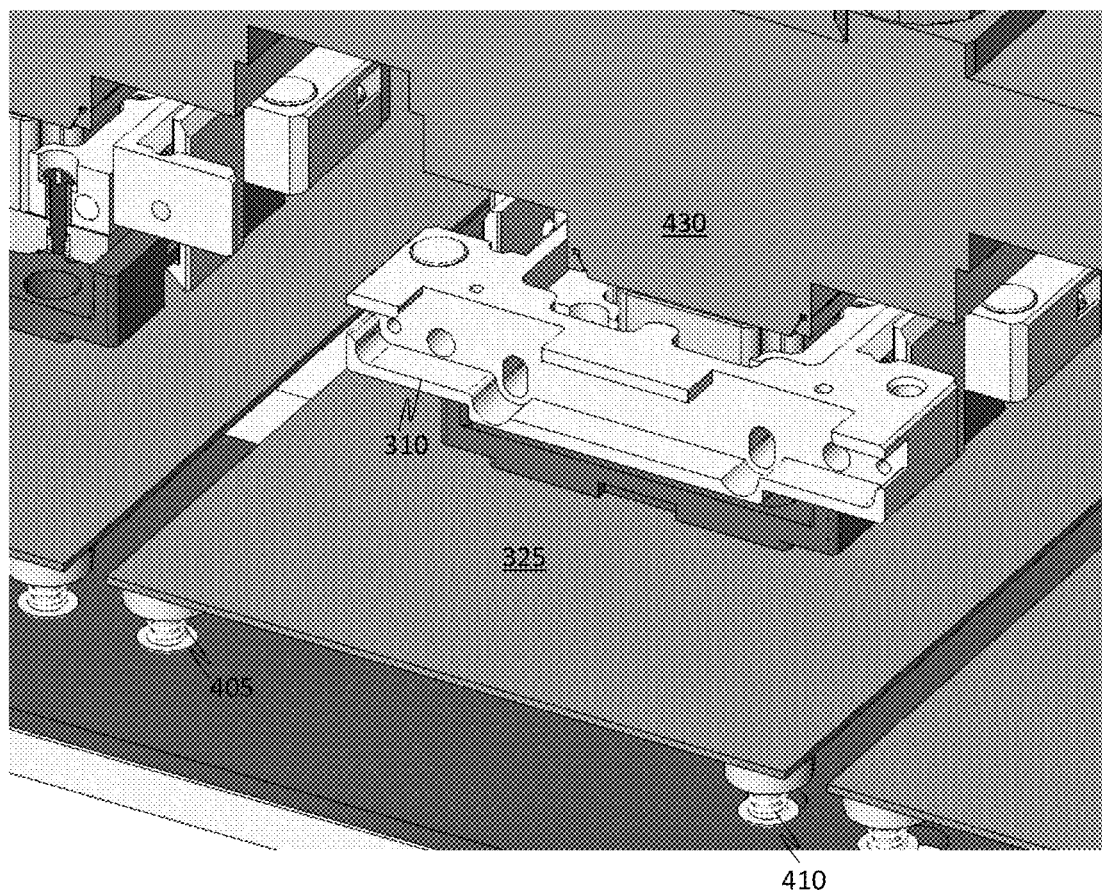
FIG. 4 is a diagram depicting a close view of an exemplary system slot thermal array with an engaged cold plate according to embodiments of the present invention.

According to some embodiments, a gimbaling mount is disposed beneath a central point of SIB 325. As depicted in FIG. 4, springs 405 and 410 are pressed down slightly during testing when superstructure 310 is brought into contact with cold plate 430, and allow SIB 325 to return to its normal position after the cold plate is lifted. The floating/gimbaling mounts 405 and 410 of SIB 325 enable the superstructure/interposer to evenly contact the TEC of cold plate 430 to improve cooling and efficiency.

Figure 5:
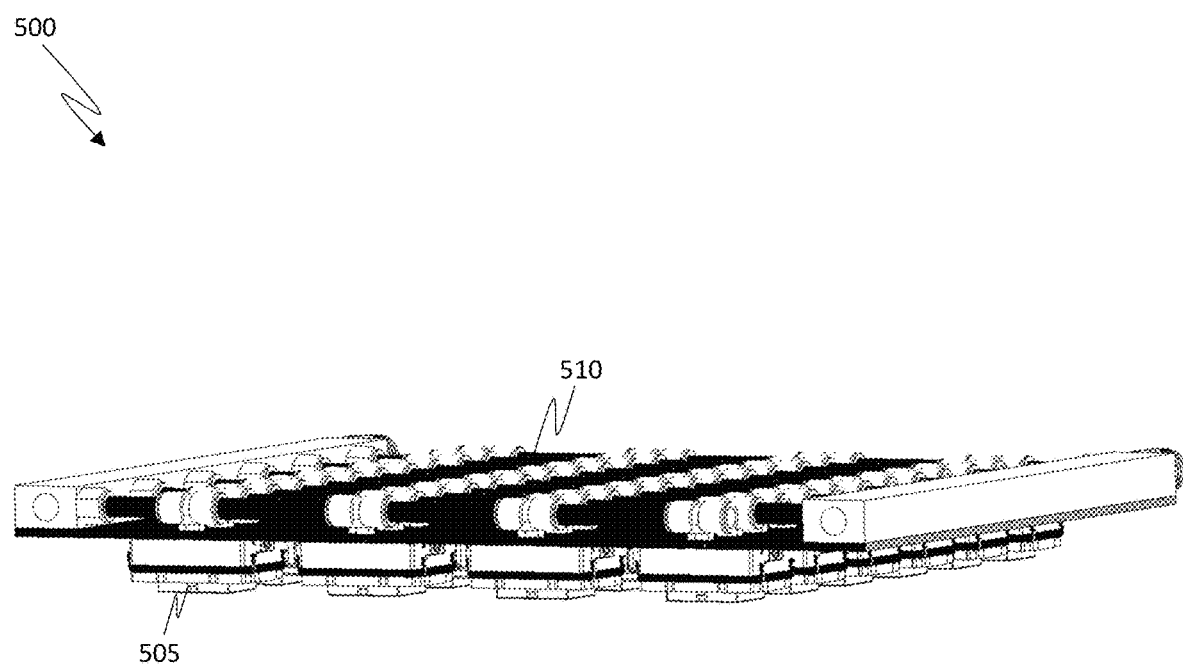
FIG. 5 depicts exemplary thermal array including thermal heads that can gimbal about a fixed point for improved cooling performance and efficiency according to embodiments of the present invention.

FIG. 5 depicts exemplary thermal array 500 including thermal heads 505 that can gimbal about a fixed point for improved cooling performance and efficiency according to embodiments of the present invention. In the example of FIG. 5, each thermal head has an independent gimbaling feature on the top side of thermal heads 505. In this way, the thermal heads evenly contact the superstructure containing the DUT during testing without any air gaps between the surface of the thermal head (e.g., cold plate) and the superstructure. Thermal array 500 is cooled by liquid cooling components 510.

Figure 6:
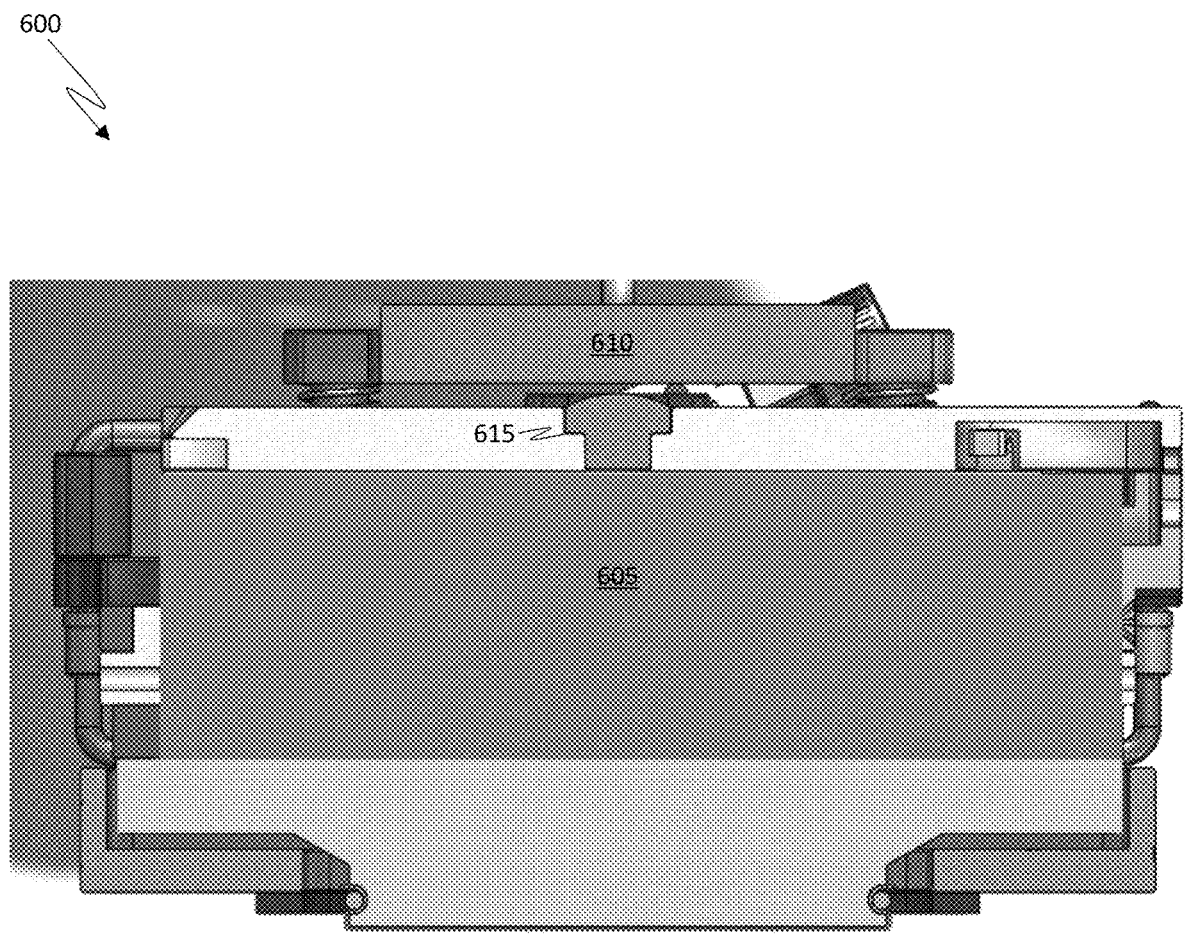
FIG. 6 depicts an exemplary gimbaled thermal head of a thermal array capable of independent gimbaling about a fixed mount to securely and evenly contact the corresponding superstructure/interposer for testing a DUT according to embodiments of the present invention.

FIG. 6 depicts an exemplary gimbaled thermal head 605 of a thermal array 600 capable of independent gimbaling about a fixed mount 610 so that thermal head 605 securely and evenly contacts the surface of the corresponding superstructure/interposer for testing a DUT according to embodiments of the present invention. The thermal head 605 can be moved/rotated about fixed mount 610 that secures thermal head 605 to the tray of the test system. In the example of FIG. 6, thermal head 605 pivots about a dome-shaped fixture to improve cooling and efficiency by ensuring proper alignment between surfaces and preventing any air gaps between them. A screw or similar fastener is used to re-center thermal head and a spring surrounding the screw us used to keep the head level when not engaged.

Figure 7:
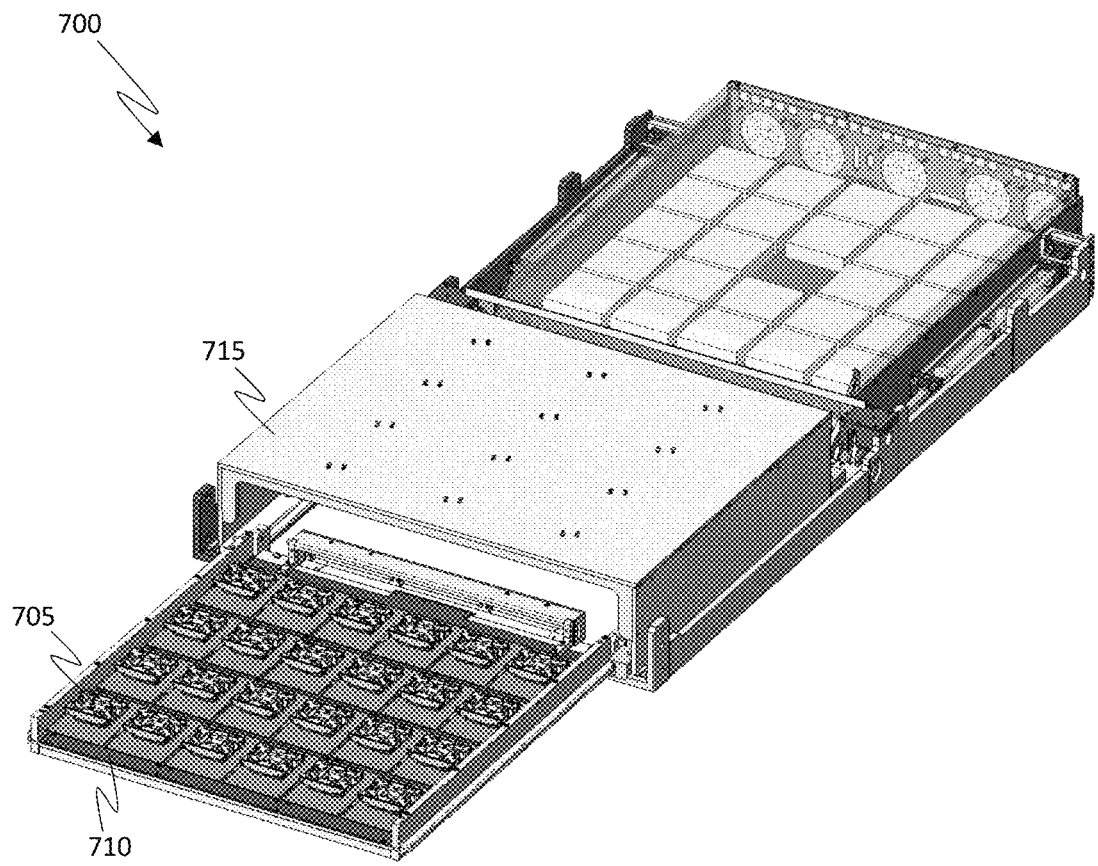
FIG. 7 depicts an exemplary testing system including a slot thermal array with individual gimbaling actuation heads for securely and evenly contacting superstructures of the TIB according to embodiments of the present invention.

FIG. 7 depicts an exemplary system slot thermal array 700 with individual gimbaling actuation heads for securely and evenly contacting superstructures 705 of test interface board 710 according to embodiments of the present invention. The testing system 700 includes a system slot power delivery board 715 to power thermal array 700 during testing to provide powerful and efficient cooling to DUTs of test interface board 710 using one or more cold plates. The thermal heads of thermal array 700 can pivot about a fixed point to bring the cold plate surface into even and secure contact with superstructures 705 of test interface board 710 for DUT testing.

Figure 8:
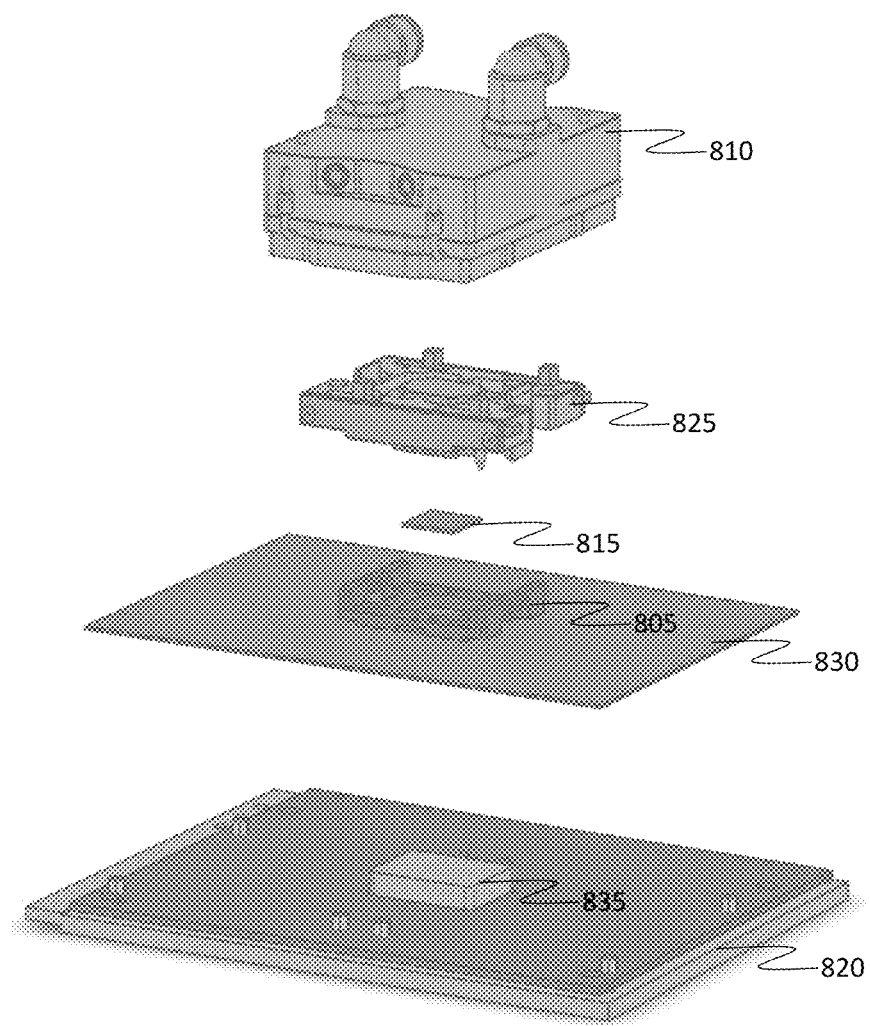
FIG. 8 depicts an exemplary actuated socket and gimbaling thermal head for cooling a DUT according to embodiments of the present invention.
Figure 9:
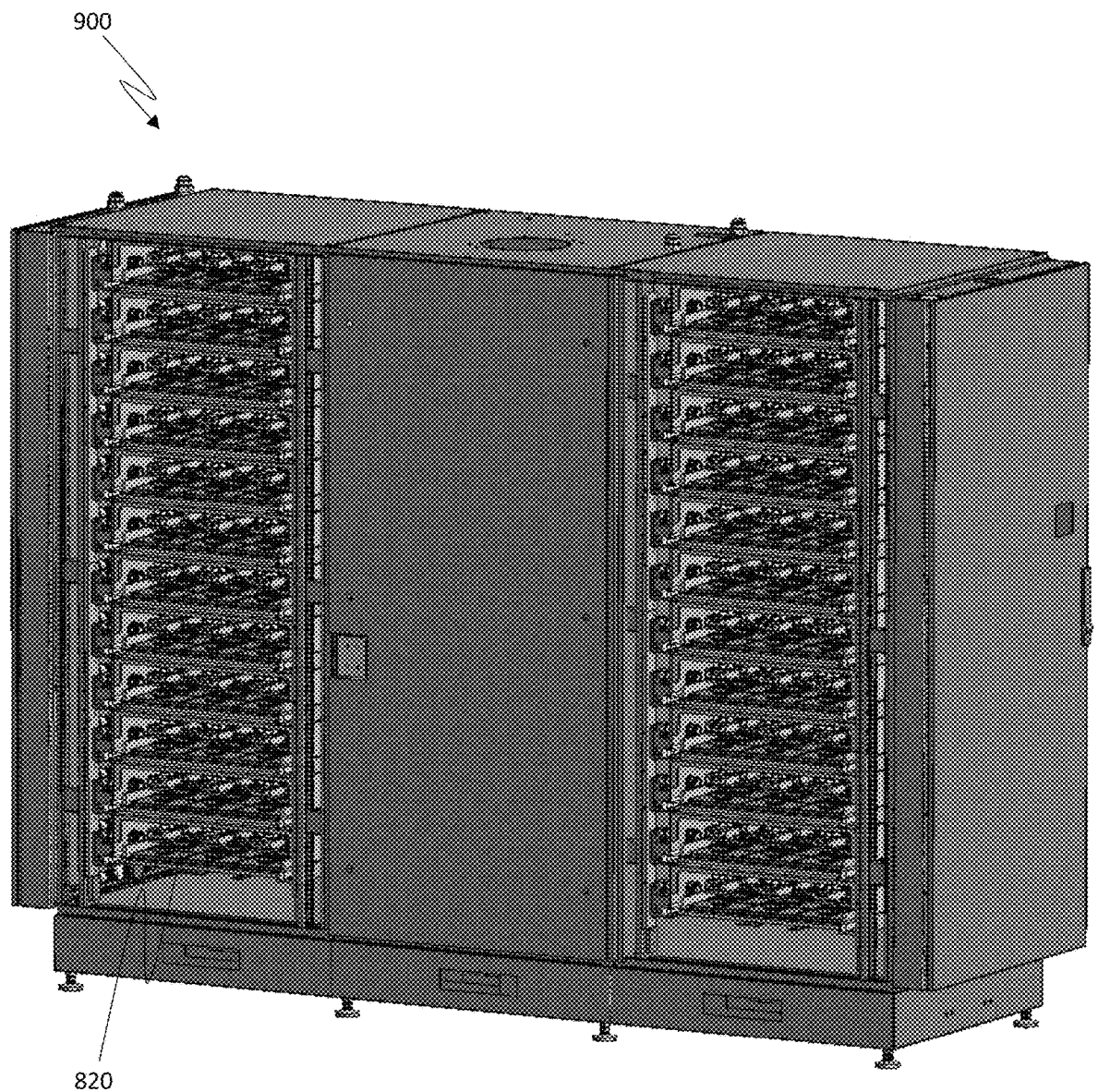
FIG. 9 depicts 24 exemplary test interface boards (TIBs) loaded into tester according to embodiments of the present invention.

FIG. 8 depicts an exemplary actuated socket 805 and gimbaling thermal head 810 for cooling DUT 815 according to embodiments of the present invention. DUT 815 is disposed in socket 805 of socket interface board 830. Test interface board 820 includes TIB support block 835 for supporting slot interface board 830. Thermal head 810 can be gimbaled about a fixed point to provide secure and even contact with superstructure 825 (or an interposer thereof). Superstructure 825 can be a self-actuating socket or a parallel socket actuator, for example. As depicted in FIG. 9, test interface board 820 can be loaded into tester 900 and connected to a tester slot for testing.

Figure 10:
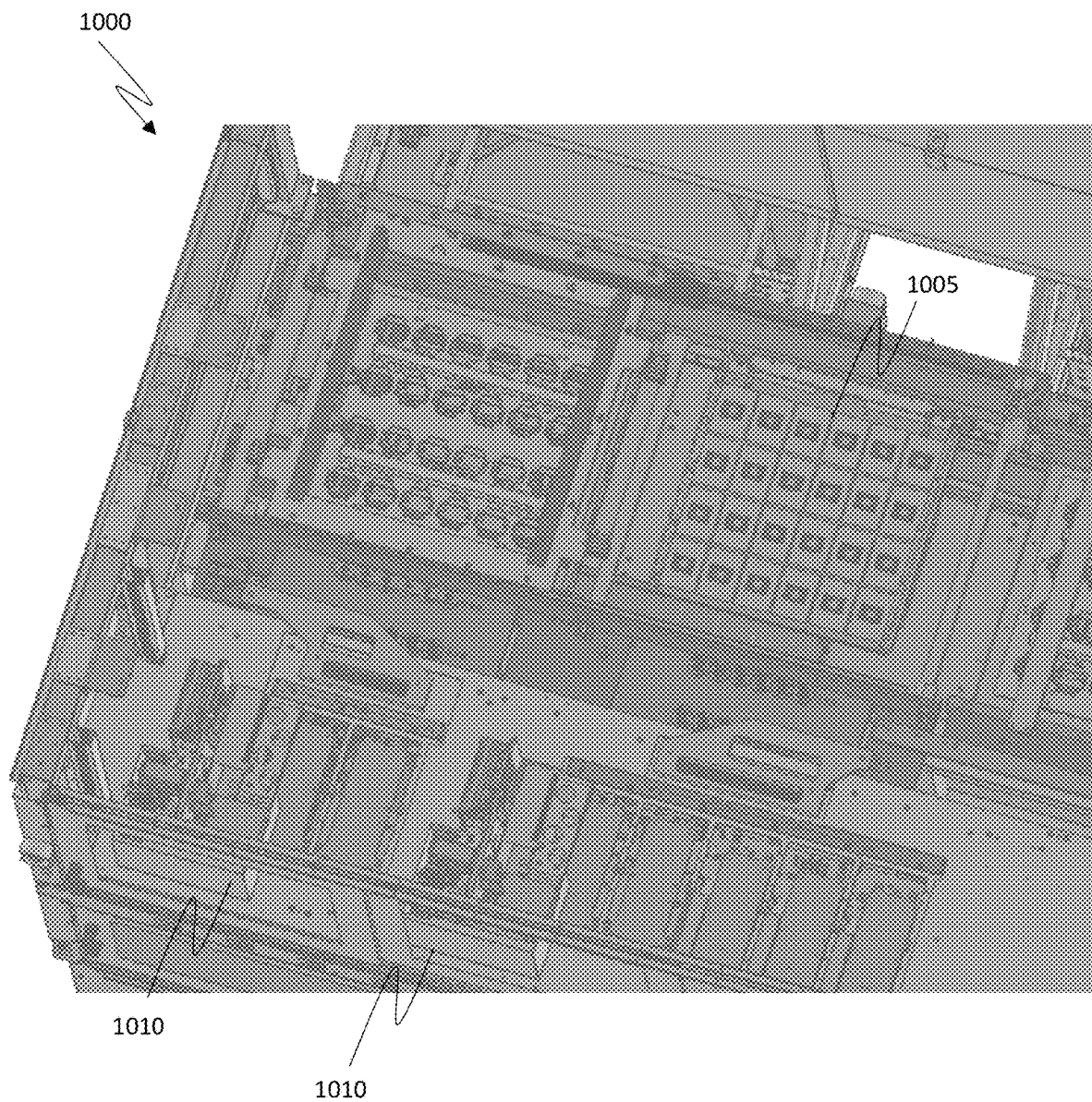
FIG. 10 depicts an exemplary tester including a test interface board ready for DUT dropping according to embodiments of the present invention.

FIG. 10 depicts an exemplary tester 1000 including a test interface board 1005 ready for DUT dropping according to embodiments of the present invention. Handler pick and place heads 1010 and 1010 transfer the DUTs from/to the TIB 1005 and the DUT trays. Test interface board 1005 can include SAS or PSA sockets, for example.

Figure 11:
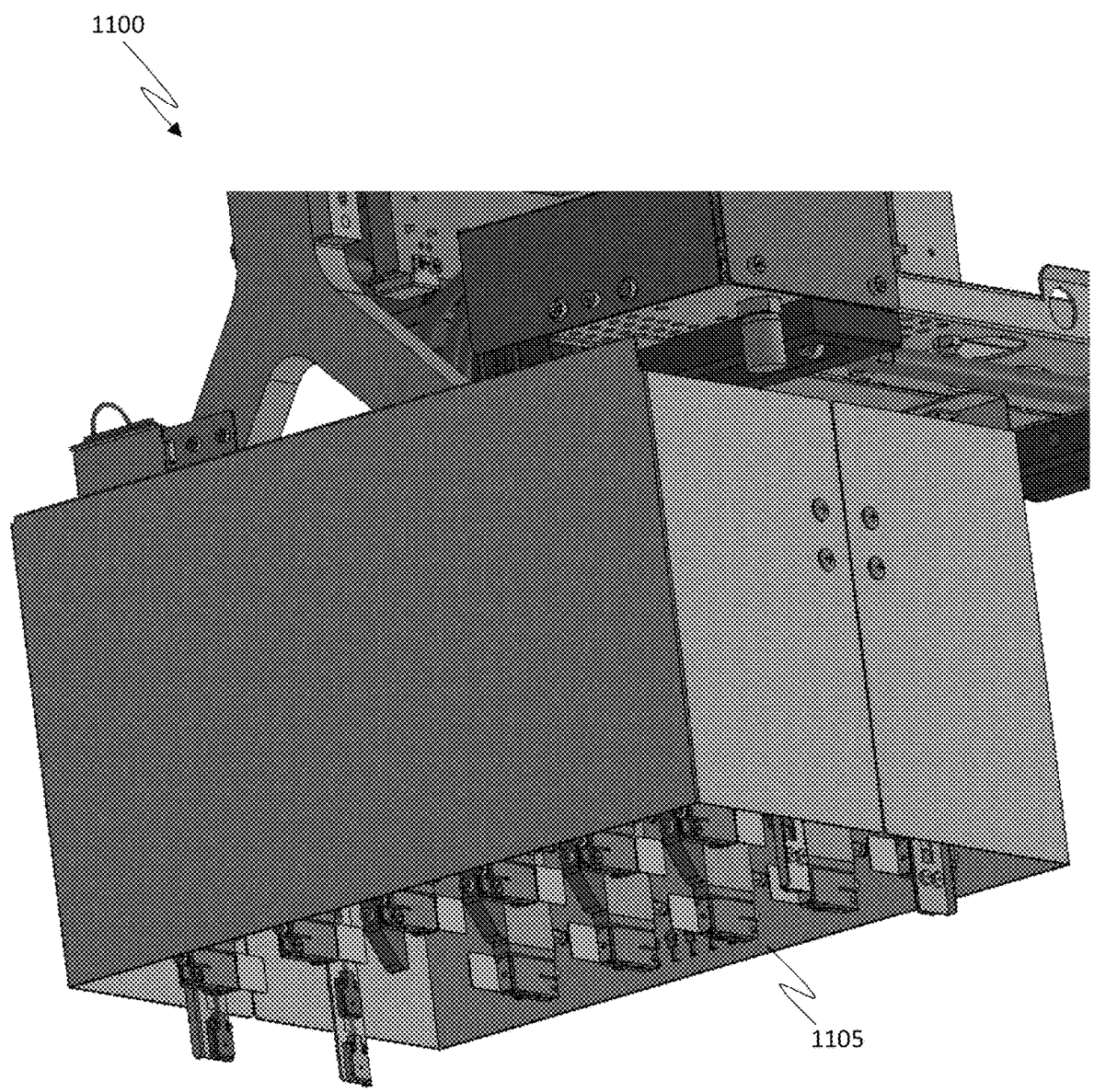
FIG. 11 depicts an exemplary handler for loading a test interface board according to embodiments of the present invention.
Figure 12:
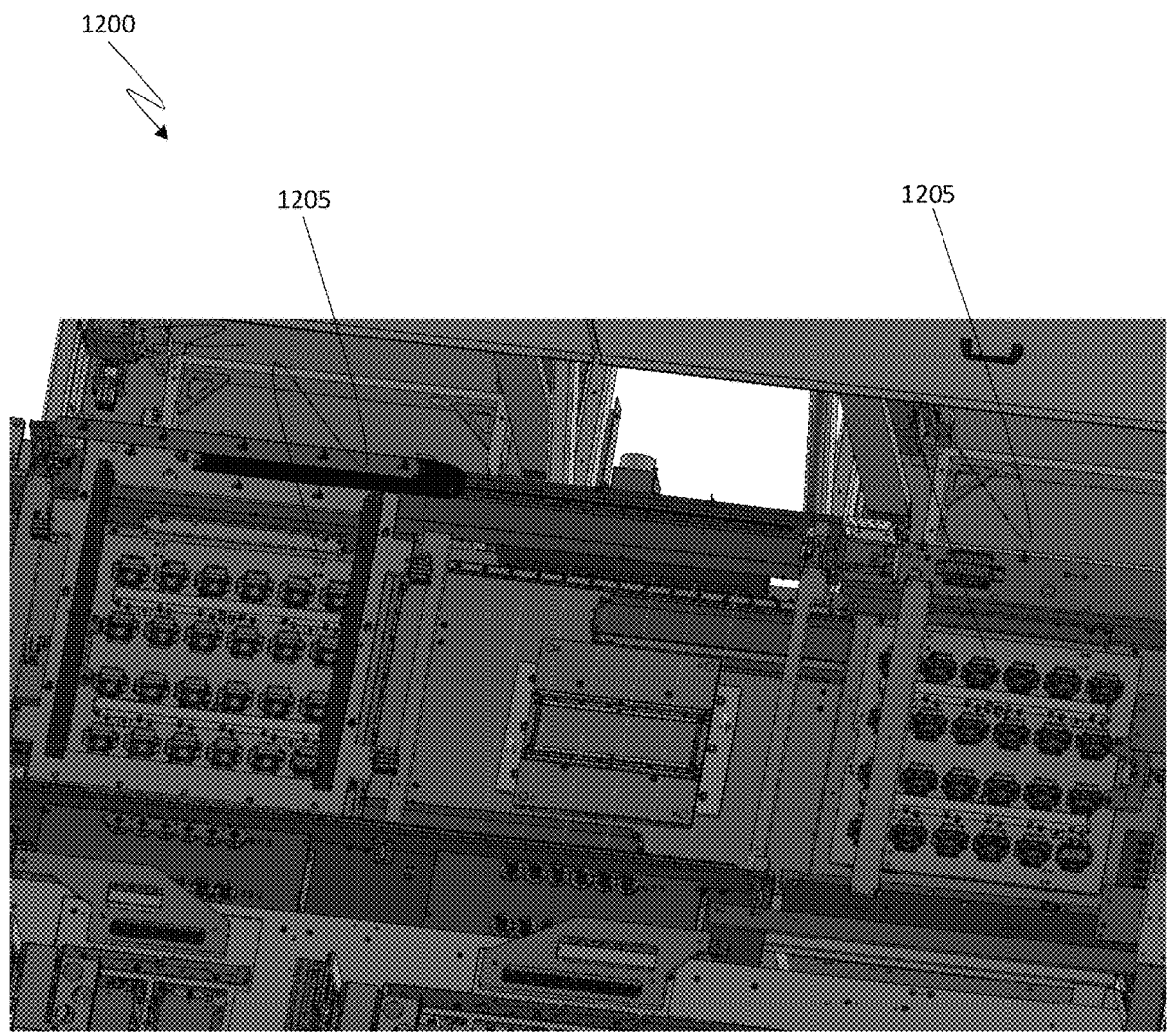
FIG. 12 depicts an exemplary PSA system disposed within a handler according to embodiments of the present invention.
Figure 13:
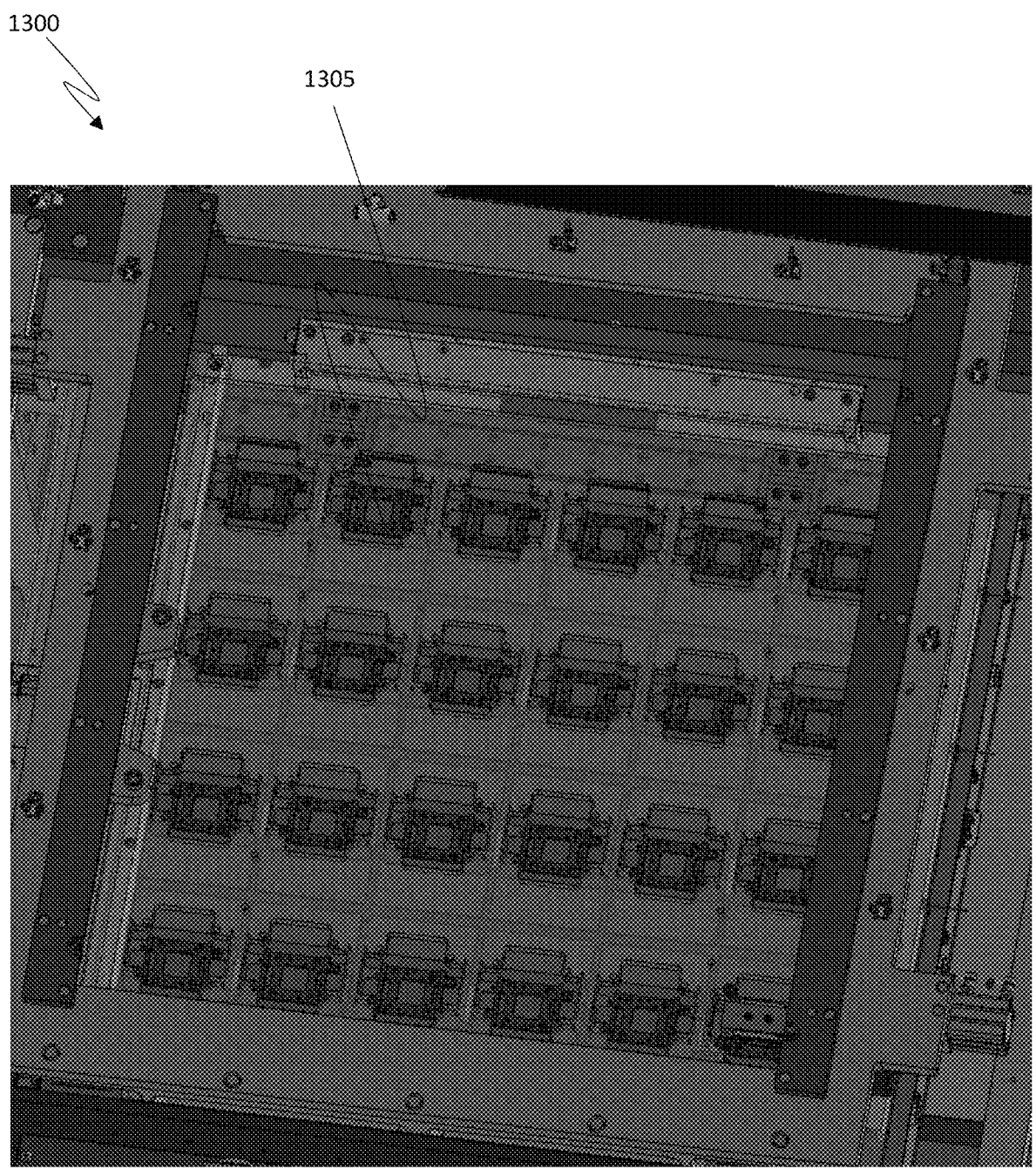
FIG. 13 depicts an exemplary test interface board under a PSA system for superstructure dropping and actuation according to embodiments of the present invention.
Figure 14:
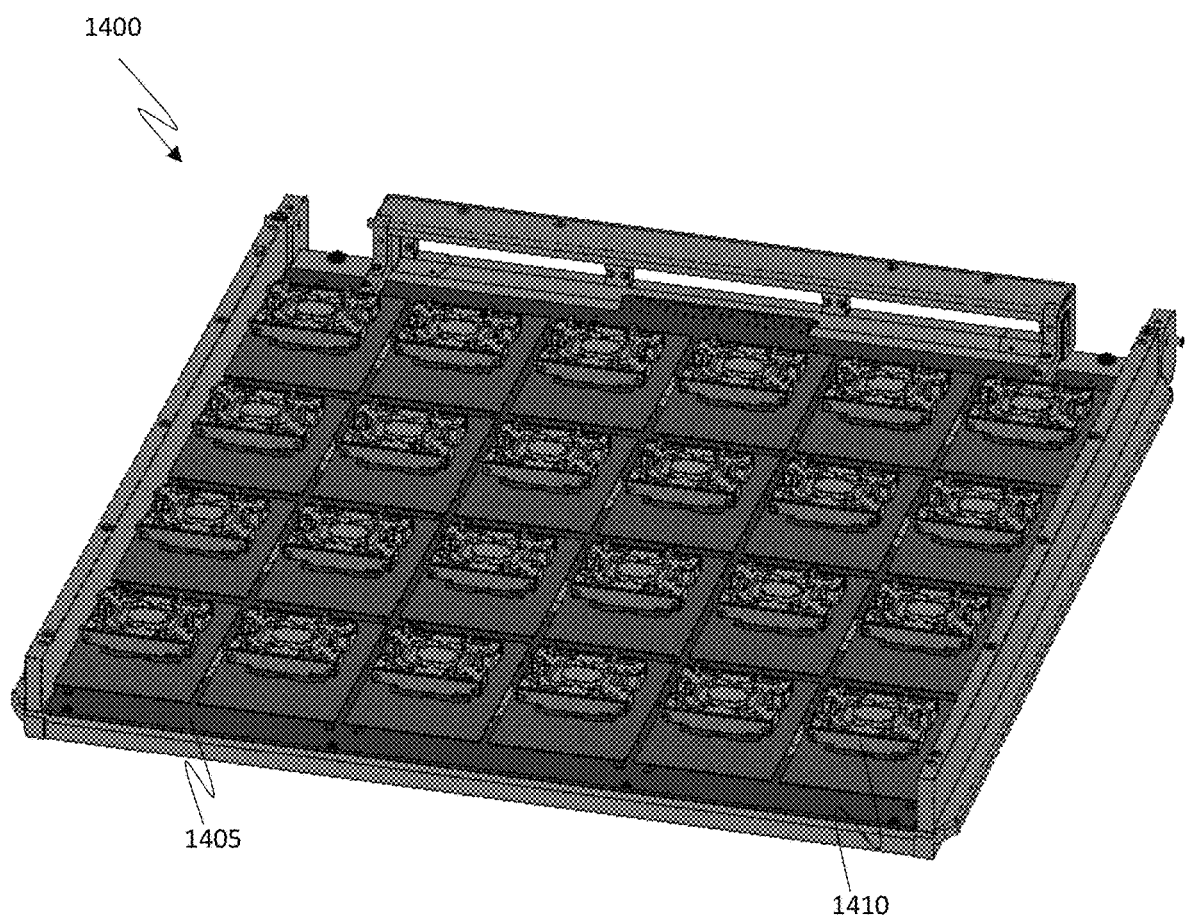
FIG. 14 depicts an exemplary test interface board ready for slot installation according to embodiments of the present invention.
Figure 15:
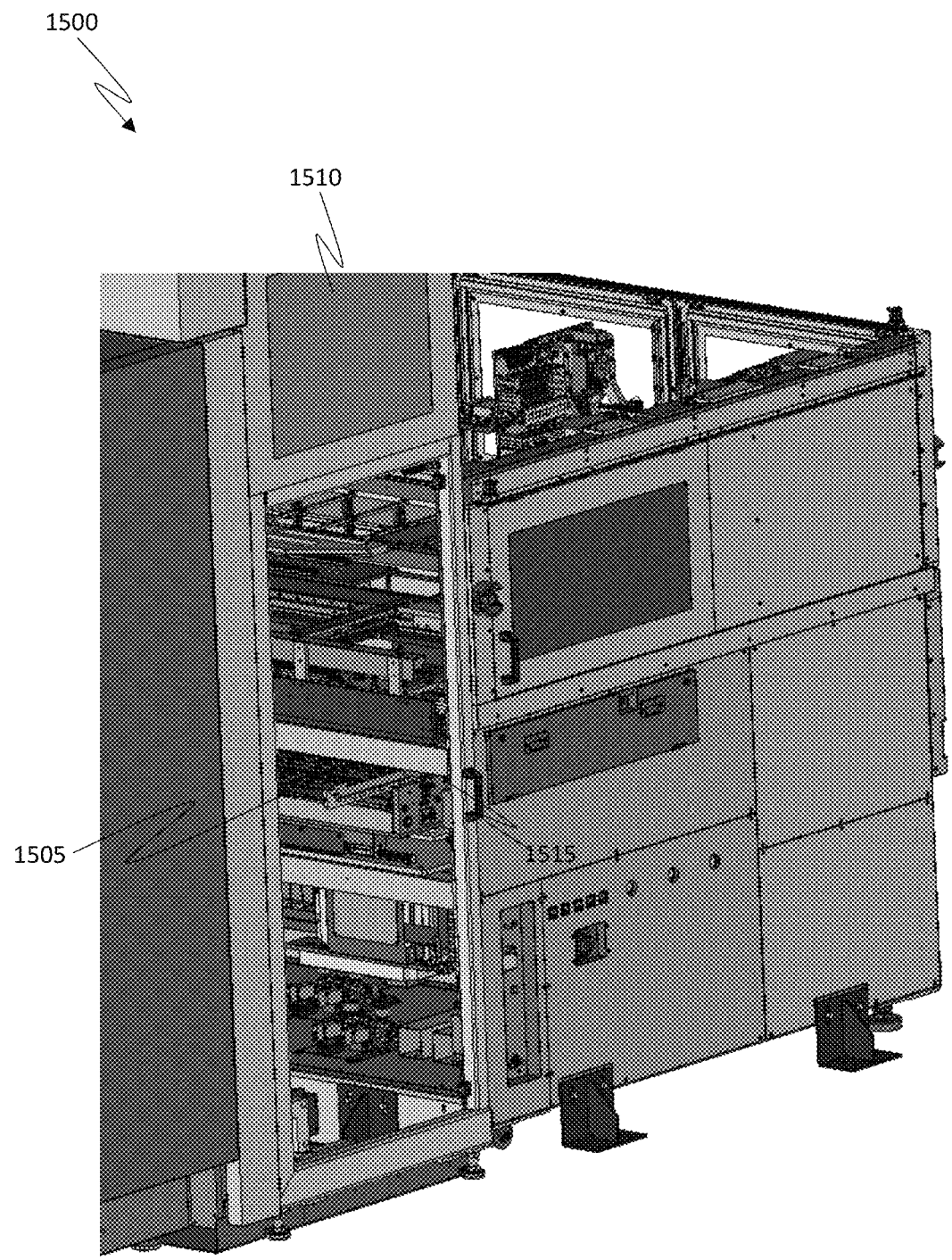
FIG. 15 depicts an exemplary test interface board loaded into an elevator for insertion into a slot tester according to embodiments of the present invention.

FIG. 11 depicts the individual DUT pick heads 1105 on the underside of a handler pick and place head 1100. Each pick head can pick up one DUT. FIG. 12 depicts an exemplary PSA system 1205 disposed within a handler according to embodiments of the present invention. FIG. 13 depicts a bottom side of exemplary test interface board 1300 under a PSA system 1305 for superstructure dropping and actuation according to embodiments of the present invention. FIG. 14 depicts an exemplary test interface board 1405 ready for slot installation according to embodiments of the present invention. The sockets of test interface board 1405 are actuated using super structures 1410. FIG. 15 depicts an exemplary test interface board 1505 loaded into an elevator 1510 for insertion into slot tester 1515 according to embodiments of the present invention.

Exemplary Test System

Embodiments of the present invention are drawn to electronic systems for device testing using liquid cooled thermal arrays (or refrigerant cooled thermal arrays) with gimbaling features to enable secure and even alignment and contact between a DUT, superstructure, or interposer, with a cold plate, heater, active thermal interface, or TEC disposed thereon. The socket that receives the DUT can be a self-actuating socket or a parallel actuation socket. The gimbaling features can be implemented using tapered screws and springs, for example.

According to some embodiments, the gimbaling features (e.g., mounts) are located on the bottom of the socket interface board to allow the socket interface board to pivot freely in three dimensions. According to some embodiments, the gimbaling features or located on the top thermal head to allow the thermal head to pivot freely in three dimensions. According to other embodiments, both the socket interface board (or test interface board) and thermal head can gimbal about fixed points as described above according to embodiments of the present invention.

Figure 16:
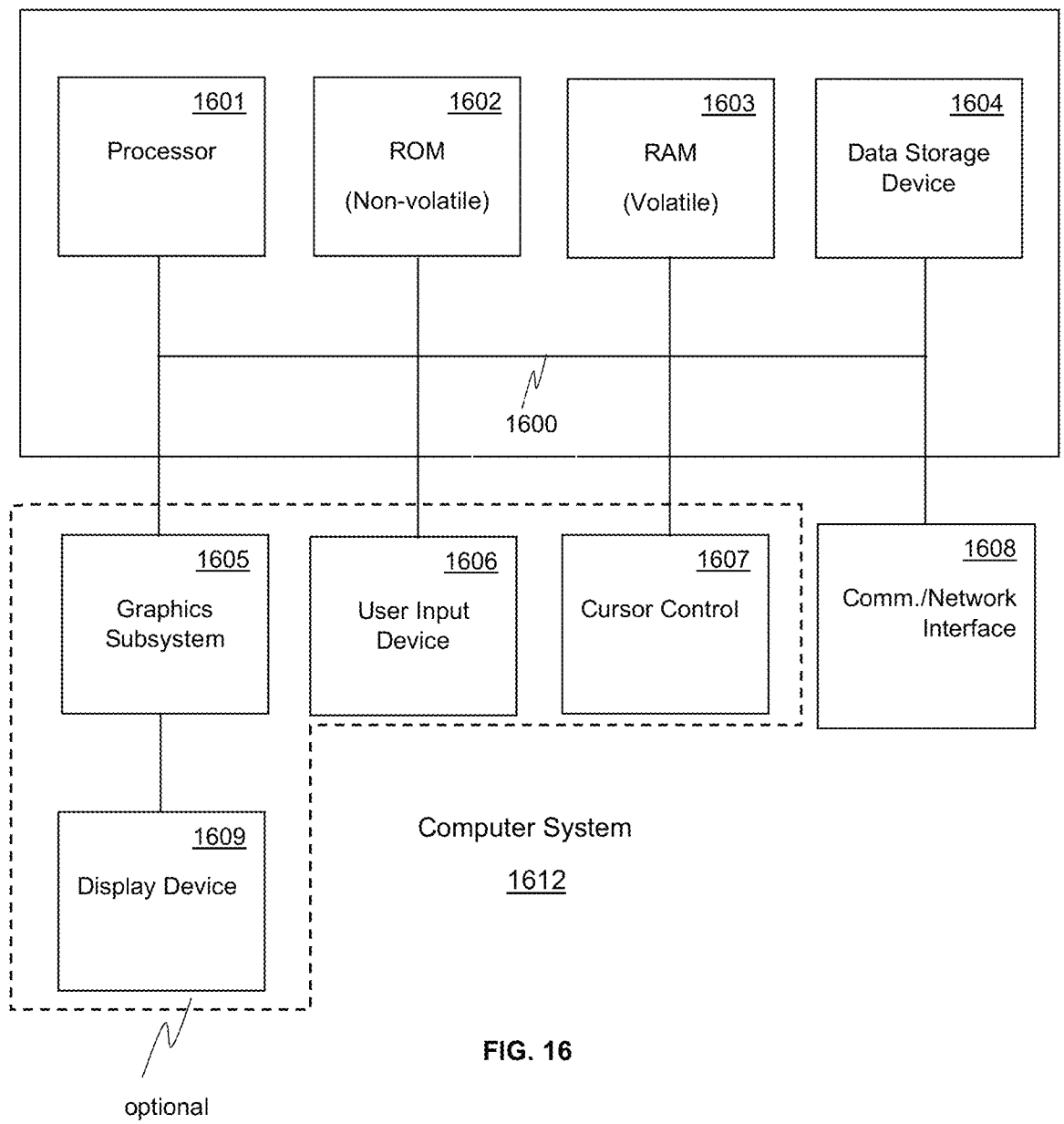
FIG. 16 depicts an exemplary computer platform upon which embodiments of the present invention may be implemented.

In the example of FIG. 16, the exemplary computer system 1612 includes a central processing unit (CPU) 1601 for running software applications and an operating system. Random access memory 1602 and read-only memory 1603 store applications and data for use by the CPU 1601. Data storage device 1604 provides non-volatile storage for applications and data and may include fixed disk drives, removable disk drives, flash memory devices, and CD-ROM, DVD-ROM or other optical storage devices. The data storage device 1604 or the memory 1602/1603 can store historic and real-time testing data (e.g., test results, limits, computations, etc.). The optional user inputs 1606 and 1607 comprise devices that communicate inputs from one or more users to the computer system 1612 (e.g., mice, joysticks, cameras, touch screens, keyboards, and/or microphones). A communication or network interface 1608 allows the computer system 1612 to communicate with other computer systems, networks, or devices via an electronic communications network, including wired and/or wireless communication and including an Intranet or the Internet.

The optional display device 1610 may be any device capable of displaying visual information, e.g., the final scan report, in response to a signal from the computer system 1612 and may include a flat panel touch sensitive display, for example. The components of the computer system 1612, including the CPU 1601, memory 1602/1603, data storage 1604, user input devices 1606, and graphics subsystem 1605 may be coupled via one or more data buses 1600.

Embodiments of the present invention are thus described. While the present invention has been described in particular embodiments, it should be appreciated that the present invention should not be construed as limited by such embodiments, but rather construed according to the following claims.

What is claimed is:

1. A test system for testing a device under test (DUT), the test system comprising:
    a test interface board (TIB);
    a socket interface board (SIB) comprising:
        a gimbaling mount that fixes the SIB to the TIB and allows the SIB to pivot freely in three dimensions; and
        a socket configured to receive the DUT;
    a superstructure that surrounds the socket; and
    a thermal array,
    wherein the DUT is disposed in the socket, and wherein under pressure the gimbaling mount allows a top surface of the superstructure to evenly and securely contact a bottom surface of the thermal array substantially without air gaps between the top surface of the superstructure and the bottom surface of the thermal array to regulate a temperature of the DUT during testing.

2. The test system of claim 1, wherein the superstructure comprises an interposer in contact with the DUT, and wherein the top surface of the superstructure is a top surface of the interposer.

3. The test system of claim 2, wherein the interposer further comprises a thermo electric cooler (TEC), and wherein the top surface of the interposer is a top surface of the TEC.

4. The test system of claim 1, wherein the socket comprises a self-actuating socket (SAS).

5. The test system of claim 1, wherein the socket comprises a parallel socket actuation (PSA) socket.

6. The test system of claim 1, further comprising a plurality of SIBs disposed on the TIB, wherein the plurality of SIBs comprise a plurality of gimbal mounts and are operable to receive a plurality of DUTs and wherein further the plurality of gimbal mounts gimbal to align the plurality of DUTs with the thermal array.

7. The test system of claim 6, wherein the thermal array comprises a plurality of thermal heads coupled to a plurality of gimballing mounts, wherein the plurality of gimballing mounts fix the plurality of thermal heads to a tray of the thermal array, and wherein the plurality of thermal heads are operable to pivot freely in three dimensions.

8. The test system of claim 7, wherein the plurality of SIBs and the plurality of thermal heads pivot due to the plurality of gimbal mounts to align top surfaces of superstructures of the plurality of SIBs with a bottom surface of the thermal heads.

9. The test system of claim 1, wherein the gimballing mount comprises a plurality of screws and springs disposed at corners of the SIB.

10. The test system of claim 1, wherein the thermal array comprises a cold plate and a thermo electric cooler (TEC).

11. A test system for testing a device under test (DUT), the test system comprising:
    a test interface board (TIB);
    a socket interface board (SIB) disposed on the TIB and comprising a socket configured to receive the DUT;
    a superstructure surrounding the socket; and
    a thermal array comprising:
        a gimbaling mount that fixes the thermal array to a fixed tray; and
        a thermal head coupled to the gimbaling mount, wherein the thermal head is operable to pivot freely in three dimensions due to the gimbal mount;
    wherein the DUT is disposed in the socket, and wherein a top surface of the superstructure under action of the gimbaling mount evenly and securely contacts a bottom surface of the thermal head substantially without air gaps between the top surface of the DUT and the bottom surface of the thermal head to temperature regulate the DUT during testing.

12. The test system of claim 11, wherein the superstructure further comprises an interposer, wherein the DUT contacts the interposer, and wherein the top surface of the superstructure is the top surface of the interposer.

13. The test system of claim 11, wherein the socket comprises a self-actuating socket (SAS).

14. The test system of claim 11, wherein the socket comprises a parallel socket actuation (PSA) socket.

15. The test system of claim 11, further comprising a plurality of SIBs disposed on the TIB, and wherein the thermal array comprises the plurality of thermal heads each comprising a respective gimbaling mount to individually gimbal said plurality of thermal heads for cooling DUTs of the plurality of SIBs.

16. The test system of claim 15, wherein the TIB comprises a TIB support block that supports the SIB.

17. The test system of claim 11, wherein the gimballing mount comprises a screw and a spring.

18. The test system of claim 11, wherein the thermal array is liquid-cooled.

19. The test system of claim 11, further comprising a second gimballing mount that fixes the SIB to the TIB, wherein the SIB is operable to pivot freely in three dimensions.

20. The test system of claim 19, wherein the SIB and the thermal head pivot to align the top surface of the superstructure with a bottom surface of the thermal head.

* * * * *